United States Patent [19]

Mogi

[11] 4,305,157
[45] Dec. 8, 1981

[54] TUNING CIRCUIT USING A PHASE-LOCKED LOOP

[75] Inventor: Takao Mogi, Tokyo, Japan

[73] Assignee: Sony Corporation, Tokyo, Japan

[21] Appl. No.: 101,138

[22] Filed: Dec. 7, 1979

[30] Foreign Application Priority Data

Dec. 15, 1978 [JP] Japan ................................ 53-155222

[51] Int. Cl.³ .............................................. H04B 1/32
[52] U.S. Cl. .................................... 455/183; 455/182;
  455/164; 455/260; 358/195.1
[58] Field of Search ............... 455/182, 183, 184, 164,
  455/173, 192, 195, 208, 214, 259, 260; 334/11,
  16; 358/191, 195, 167

[56] References Cited

U.S. PATENT DOCUMENTS

| 4,081,752 | 3/1978 | Sumi | 455/183 |
| 4,088,959 | 5/1978 | Sumi | 455/183 |
| 4,110,694 | 8/1978 | Wilhelm | 455/183 |
| 4,128,849 | 12/1978 | Rhee | 455/185 |

*Primary Examiner*—Joseph A. Orsino, Jr.
*Assistant Examiner*—Tommy P. Chin

*Attorney, Agent, or Firm*—Lewis H. Eslinger; Alvin Sinderbrand

[57] ABSTRACT

A tuning apparatus includes an RF amplifier for receiving a video signal corresponding to a selected channel, a voltage controlled oscillator for producing a local oscillation signal, a mixing circuit for converting the received video signal to an intermediate frequency signal with the local oscillation signal, a programmable frequency divider selectively receiving the local oscillation signal and the intermediate frequency signal and producing a frequency-divided output signal, a phase comparator for comparing the frequency-divided output signal with a reference oscillation signal so as to control the voltage controlled oscillator, a switching circuit for selectively supplying the local oscillation signal and the intermediate frequency signal to the programmable frequency divider, and a control circuit for selectively enabling the switching circuit to supply the local oscillation signal to the programmable frequency divider during a predetermined time after the channel is selected and to supply the intermediate frequency signal after the predetermined time, the control circuit also controlling the RF amplifier and the voltage controlled oscillator in accordance with a frequency band containing the selected channel.

8 Claims, 1 Drawing Figure

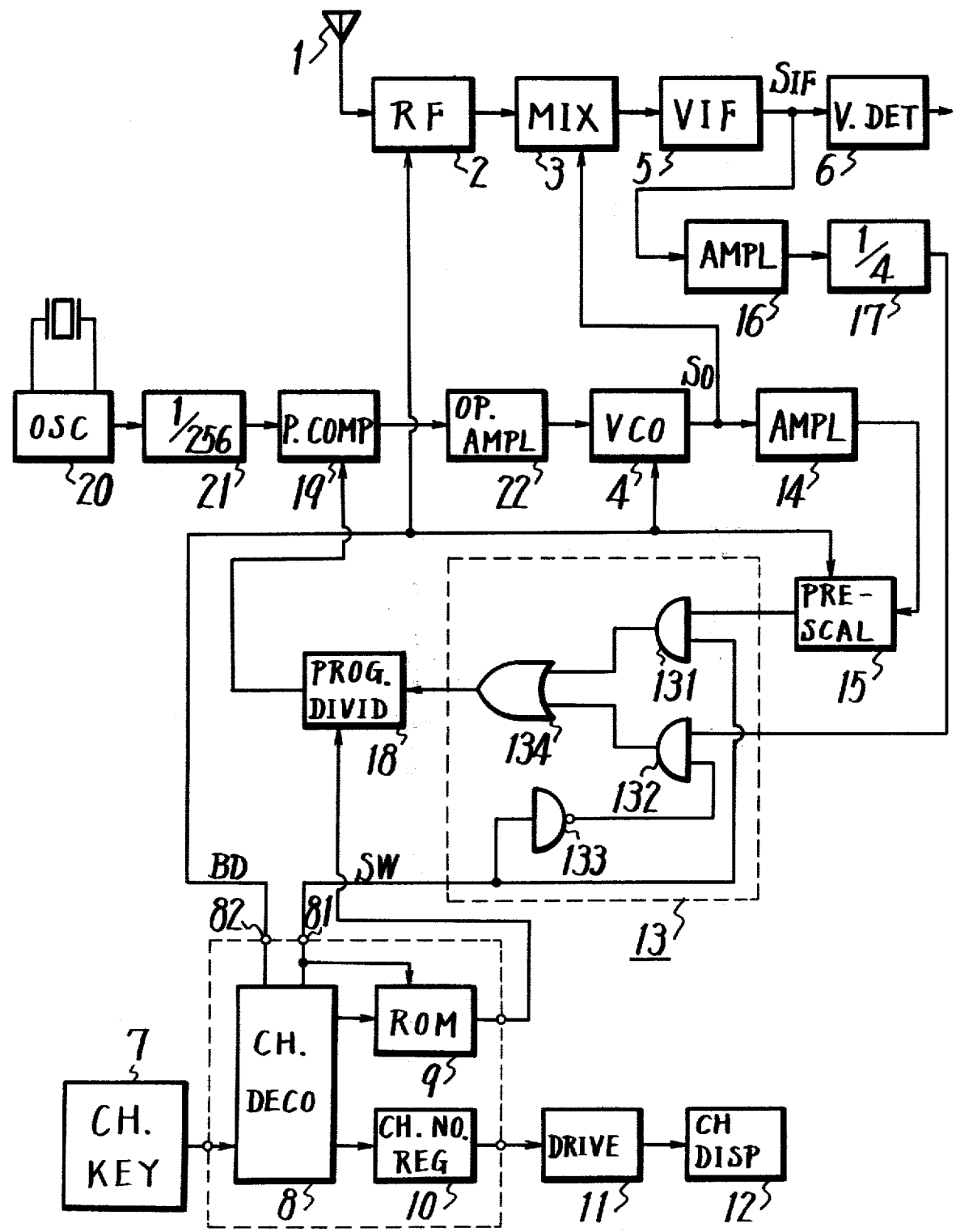

TUNING CIRCUIT USING A PHASE-LOCKED LOOP

BACKGROUND OF THE INVENTION

1. Field of the Invention

This invention relates generally to a tuning apparatus for carrying out an accurate channel selection operation by using a PLL (phase locked loop) circuit upon the reception and selection of a television signal or the like and, more particularly, is directed to a tuning apparatus which achieves accurate channel tuning even if the broadcast frequency of a received broadcast wave is off-set.

2. Description of the Prior Art

In the prior art, when a received broadcast wave is off-set, an intermediate frequency signal derived therefrom is frequency-discriminated to produce an analog signal corresponding to the tuning shift so as to tune the receiver to the received broadcast wave. Such prior art tuning apparatus, however, is rather complicated in construction, low in channel attraction speed and generally requires further adjustment.

OBJECTS AND SUMMARY OF THE INVENTION

Accordingly, it is an object of this invention to provide an improved tuning apparatus that avoids the above-described difficulties encountered with the prior art.

More particularly, it is an object of this invention to provide a tuning apparatus which is simple in construction, high in channel attraction speed and requires no further adjustment.

In accordance with an aspect of this invention, a tuning apparatus includes means for receiving a video signal corresponding to a selected channel; converting means for converting the received video signal to an intermediate frequency video signal, including a variable oscillator for producing a local oscillation signal and a mixer for converting the received video signal to the intermediate frequency video signal with the local oscillation signal; and means for controlling the converting means as a function of the local oscillation signal during a first predetermined time after a channel is selected and as a function of the intermediate frequency video signal after the predetermined time.

The above, and other, objects, features and advantages of the invention, will be apparent in the following detailed description of an illustrative embodiment of the invention which is to be read in connection with the accompanying drawing.

BRIEF DESCRIPTION OF THE DRAWING

The FIGURE is a block diagram of an embodiment of a tuning apparatus according to the present invention.

DESCRIPTION OF THE PREFERRED EMBODIMENT

Referring to the drawing, there is shown an embodiment of a tuning apparatus according to this invention which is adapted to receive and select a television signal.

In the FIGURE, an antenna 1 receives a television signal and supplies the same through an RF (radio frequency) amplifier circuit 2 to a mixer circuit 3. A VCO (voltage controlled oscillator) 4 supplies an oscillation signal $S_O$ having a predetermined local oscillation frequency corresponding to a selected channel to mixer circuit 3. Mixer 3 then multiplies the signal from RF amplifier circuit 2 and oscillation signal $S_O$ from VCO 4 to produce an IF (intermediate frequency) signal having a frequency intermediate those of oscillation signal $S_O$ and the signal from RF amplifier circuit 2, for example, 58.75 MHz. This IF signal from mixer circuit 3 is fed through a VIF (video intermediate frequency) amplifier circuit 5 to a video detector circuit 6 which produces the video output signal.

The oscillation frequency of oscillation signal $S_O$ is controlled as follows: The tuning apparatus includes a channel selection key device 7, a channel selection decoder circuit 8, a ROM (read only memory) 9 and a channel number register 10 in which the latter may be made from a single IC (integrated circuit).

When a key from channel selection key device 7, which corresponds to, for example, channel "1", is depressed, decoder circuit 8 discriminates or detects the depression of such key. Then, a detected output from decoder circuit 8 is fed to channel number register 10 which supplies information signal representing channel "1" through a drive circuit 11 to a channel display device 12 on which the number "1" is displayed.

Decoder circuit 8 also produces a signal SW which is at logic level "1" during a predetermined time period $\tau$, which may be for example, 100 m sec measured from the time when the above identified key is depressed. The signal SW is supplied through an output terminal 81 to a change-over switch 13 which includes AND gates 131 and 132, an inverter 133 and an OR gate 134. That is, the signal SW is supplied through terminal 81 to one of the input terminals of AND gate 131 and also to one of the input terminals of AND gate 132 through inverter 133.

The oscillation signal $S_O$ from VCO 4 is fed through an amplifier circuit 14 to a pre-scalar circuit 15 where it is frequency-divided to a low frequency. The output singal from pre-scalar circuit 15 is then fed to the other input terminal of AND gate 131.

An IF signal $S_{IF}$ from VIF amplifier circuit 5 is supplied through an amplifier circuit 16 to a frequency divided 17 to be frequency-divided by, for example, ¼. The output signal from frequency divider 17 is supplied to the other input terminal of AND gate 132.

During the predetermined time period $\tau$, which begins when the channel selection key is depressed, the signal SW is at logic level "1". Thus, during this time period $\tau$, AND gate 131 is open so that the output signal from pre-scalar circuit 15 is supplied through AND gate 131 and OR gate 134 to a variable frequency divider circuit 18 which is programmed to provide a frequency dividing ratio determined by an output code from ROM 9. That is, during the time period $\tau$, an address which corresponds to a depressed key, for example, channel "1", is supplied from channel selection decoder circuit 8 to ROM 9 which in turn delivers an output code representing channel "1" to variable frequency divider circuit 18. Therefore, it is seen that the frequency dividing ratio thereof is made to correspond to channel "1". The output signal from variable frequency divider circuit 18 is then supplied to a phase comparator circuit 19.

A quartz oscillator 20 a reference oscillation signal to a frequency divider 21, and the frequency-divided signal from frequency divider 21 is supplied to phase comparator circuit 19. Thus, if the phase comparing frequency of phase comparator circuit 19 is selected to be, for example, 15.625 KHz, selected to be the oscillation frequency of quartz oscillator 20 can be for example, 4 MHz and the frequency dividing ratio of frequency divider 21 can therefore be selected as 1/256.

If the frequency dividing ratio of pre-scalar circuit 15 is selected to be, for example, 1/64, and the local oscillation frequency for the channel "1" signal is selected as 91.25 MHz 58.75 MHz (from VCO 4) = 150 MHz, then the frequency dividing ratio of variable frequency divider circuit 18 is preferably selected as 1/150.

In this manner, the local oscillation frequencies of the other channel numbers (that is, the oscillation frequencies of VCO 4), the output codes from ROM 9 and the frequency dividing ratios of variable frequency divider circuit 18 are determined according to the following table.

TABLE

| BAND | CHANNEL NUMBER | LOCAL OCS. FREQUENCY | OUTPUT CODE FROM ROM 9 (BINARY NOTATION) | FREQUENCY DIVIDING RATIO |
|---|---|---|---|---|
| LOW CHANNEL | 1 | 150 MHz | 0010010110 | 150 |
| | 2 | 156 | 0010011100 | 156 |
| | 3 | 162 | 0010100010 | 162 |
| HIGH CHANNEL | 4 | 230 | 0011100110 | 230 |
| | 5 | 236 | 0011101100 | 236 |
| | 6 | 242 | 0011110010 | 242 |
| | 7 | 248 | 0011111000 | 248 |
| | 8 | 252 | 0011111011 | 252 |
| | 9 | 258 | 0100000010 | 258 |
| | 10 | 264 | 0100001100 | 264 |
| | 11 | 270 | 0100010010 | 270 |
| | 12 | 276 | 0100011000 | 276 |
| VHF CHANNEL | 13 | 530 | 1000010010 | 530 |
| | 14 | 536 | 1000011000 | 536 |
| | 15 | 542 | 1000011110 | 542 |
| | 62 | 824 | 1100111000 | 824 |
| INTERMEDIATE FREQUENCY SIGNAL | | 58.75 | 1110101100 | 940 |

In phase comparator circuit 19, the frequency-divided reference oscillation signal from frequency divider circuit 21 and the signal from variable frequency divider circuit 18 are phase-compared, and compared error voltage from phase comparator circuit 19 is supplied through an operational amplifier 22 to the VCO 4. Thus, oscillation signal $S_O$ from VCO 4 is controlled such that the oscillation frequency thereof is 150 MHz for channel "1" and is correct due to the accuracy of quartz oscillator 20.

Further, decoder circuit 8 produces a band change-over signal BD in correspondence with whether the selected channel is a low channel, a high channel or a UHF channel, and this signal BD is fed through output terminal 82 to RF amplifier circuit 2, VCO 4, and pre-scalar circuit 15 in accordance with the frequency band associated with the selected channel.

After the desired channel selection key has been depressed for a predetermined time, the signal SW from decoder circuit 8 produces a logic level "0" signal. Therefore, in change-over circuit 13, AND gate 131 closes while AND gate 132 opens. Then, the frequency divided IF signal from frequency divider 17 is supplied through AND gate 132 and OR gate 134 to variable frequency divider circuit 18. At this time, the output code from ROM 9 changes from the predetermined one corresponding to the selected channel to a special code corresponding to the local oscillator frequency of 58.75 MHz shown in the last row of the above table. Thus, the frequency dividing ratio of variable frequency divider circuit 18 becomes 1/940.

Similarly, the output signal from variable frequency divider circuit 18 and the output signal from frequency divider circuit 21 are phase-compared by phase comparator circuit 19 and the compared error voltage produced thereby is supplied through operational amplifier 22 to VCO 4 to thereby control the oscillation frequency thereof.

Thus, if the frequency of the IF signal $S_{IF}$ from VIF amplifier circuit 5 is 58.75 MHz, the frequency of the output signal from variable frequency divider circuit 18 becomes 15.625 KHz. Therefore, the oscillation frequency of the oscillation signal $S_O$ produced by VCO 4 is controlled so that the intermediate frequency thereof becomes 58.75 MHz. That is, even if the frequency of a broadcast wave from a broadcast station is off-set, the local oscillation frequency is controlled so as to make the intermediate frequency thereof equal to 58.75 MHz. Thus, the tuning apparatus can be correctly turned to the off-set broadcast wave.

As described above, according to the present invention, after the channel selection key has been depressed, the local osicllation frequency and a reference frequency are compared and the compared output signal is used to control the local oscillation frequency. At the end of a predetermined time period, the intermediate frequency and the reference frequency are then compared and this compared output is then used to control the local oscillation frequency. Therefore, even if the broadcast wave frequency from a received broadcast station is off-set, the tuning apparatus of the invention can be correctly tuned to the received broadcast wave.

It is therefore readily seen that the tuning apparatus of the present invention is simple in construction while having a high channel attraction speed as compared with prior art apparatus. Also, no further adjustment is required with the tuning apparatus according to this invention.

It is further to be noted that the PLL circuit consisting of VCO 4, variable frequency divider circuit 18, phase comparator circuit 19 and reference oscillator 20, can be made from a single chip so as to simplify the construction.

Further, according to the present invention, when fine tuning an off-set broadcast wave such fine tuning is extremely accurate due to the accuracy of quartz oscillator 20.

Having described a specific preferred embodiment of the invention with reference to the accompanying drawing, it is to be understood that the invention is not limited to that precise embodiment, and that various changes and modifications may be effected therein by one skilled in that art without departing from the scope or spirit of the invention as defined in the appended claims.

I claim as my invention:

1. A tuning apparatus, comprising:
    a voltage controlled oscillator for producing a local oscillation signal;
    a mixer for converting a received video frequency signal to an intermediate frequency signal with said local oscillation signal;

a programmable frequency divider;

a reference oscillator for generating a reference oscillation signal;

a phase comparator for comparing said reference oscillation signal and an output signal from said programmable frequency divider and for controlling the oscillation frequency of said local oscillation signal in response to such comparison;

first control means for controlling the dividing ratio of said programmable frequency divider;

switching means having a first switching condition for supplying said local oscillation signal to said programmable frequency divider and a second switching condition for supplying said intermediate frequency signal to said programmable frequency divider; and second control means for controlling the switching condition of said switching means.

2. A tuning apparatus according to claim 1; in which the dividing ratio of said programmable frequency divider is varied in accordance with a channel that is selected, and said switching means is switched to said first condition during a predetermined time after said channel is selected and the dividing ratio of said programmable frequency divider is fixed to a predetermined ratio and said switching means is switched to said second condition after said predetermined time.

3. A tuning apparatus comprising:

means for receiving a video signal corresponding to a selected channel;

converting means for converting said received video signal to an intermediate frequency video signal, including variable oscillator means for producing a local oscillation signal and mixer means for converting said received video signal to said intermediate frequency video signal with said local oscillation signal;

means for controlling said converting means as a function of said local oscillation signal during a predetermined time after said channel is selected and as a function of said intermediate frequency video signal after said predetermined time, said means for controlling including reference oscillator means for producing a reference oscillation signal and comparator means for effecting comparisons of said reference oscillation signal with a signal corresponding to said local oscillation signal during said predetermined time and with a signal corresponding to said intermediate frequency video signal after said predetermined time and for controlling said variable oscillator means in response to said comparisons during respective times; and switching means for selectively supplying said signal corresponding to said intermediate frequency video signal and said signal corresponding to said local oscillation signal to said comparator means for said comparisons with said reference oscillation signal.

4. A tuning apparatus according to claim 3; further including means for selectively enabling said switching means to supply said signal corresponding to said local oscillation signal and said signal corresponding to said intermediate frequency video signal to said comparator means.

5. A tuning apparatus according to claim 4; in which said switching means includes first gating means supplied with said signal corresponding to said local oscillation signal and second gating means supplied with said signal corresponding to said intermediate frequency video signal, and said means for selectively enabling selectively enables said first and second gating means for supplying said signals corresponding to said local oscillation signal and said intermediate frequency video signal, respectively, to said comparator means.

6. A tuning apparatus comprising:

means for receiving a video signal corresponding to a selected channel;

converting means for converting said received video signal to an intermediate frequency video signal, including variable oscillator means for producing a local oscillation signal and mixer means for converting said received video signal to said intermediate frequency video signal with said local oscillation signal;

means for controlling said converting means as a function of said local oscillation signal during a predetermined time after said channel is selected and as a function of said intermediate frequency video signal after said predetermined time, said means for controlling including reference oscillator means for producing a reference oscillation signal and comparator means for effecting comparisons of said reference oscillation signal with said local oscillation signal during said predetermined time and with said intermediate frequency video signal after said predetermined time and for controlling said variable oscillator means in response to said comparisons during respective times;

switching means for selectively supplying said intermediate frequency video signal and said local oscillation signal to said comparator means for said comparisons with said reference oscillation signal, said switching means including first gating means supplied with said local oscillation signal and second gating means supplied with said intermediate frequency video signal;

means for selectively enabling said switching means to supply said local oscillation signal and said intermediate frequency video signal to said comparator means, in which said means for selectively enabling selectively enables said first and second gating means for supplying said local oscillation signal and said intermediate frequency video signal to said comparator means; and a programmable frequency divider selectively supplied with said local oscillation signal and said intermediate frequency video signal for frequency dividing the signal selectively supplied thereto and supplying a frequency-divided signal to said comparator means where it is compared with said reference oscillation signal.

7. A tuning apparatus according to claim 6; in which said means for selectively enabling controls the dividing ratio of said programmable frequency divider during said predetermined time in accordance with the channel that is selected and in accordance with a predetermined code after said predetermined time.

8. A tuning apparatus according to claim 4; in which said means for selectively enabling controls said means for receiving and said variable oscillator means in accordance with a respective frequency band containing said selected channel.

* * * * *